United States Patent [19]
Toyoda

[11] Patent Number: 5,285,095
[45] Date of Patent: Feb. 8, 1994

[54] SEMICONDUCTOR INTEGRATED CIRCUIT WITH INPUT PROTECTIVE TRANSISTOR EFFECTIVE AGAINST ELECTRIC SURGE

[75] Inventor: Shuji Toyoda, Tokyo, Japan

[73] Assignee: NEC Corporation, Tokyo, Japan

[21] Appl. No.: 896,668

[22] Filed: Jun. 10, 1992

[30] Foreign Application Priority Data

Jun. 13, 1991 [JP] Japan ............... 3-140567

[51] Int. Cl.$^5$ ............................................. H01L 23/62
[52] U.S. Cl. ................................. 257/360; 257/355; 257/356; 257/357
[58] Field of Search ............. 257/355, 356, 357, 360, 257/361, 362

[56] References Cited

U.S. PATENT DOCUMENTS

| | | | |
|---|---|---|---|
| 4,602,267 | 7/1986 | Shirato | 257/360 |
| 4,786,956 | 11/1988 | Puar | 257/361 |
| 4,807,080 | 2/1989 | Clark | 257/360 |
| 4,893,157 | 1/1990 | Miyazawa | 257/360 |
| 5,021,853 | 6/1991 | Mistry | 257/357 |
| 5,083,172 | 1/1992 | Kiyono | 257/356 |

FOREIGN PATENT DOCUMENTS

| | | | |
|---|---|---|---|
| 52-75187 | 6/1977 | Japan | 257/356 |
| 53-121579 | 10/1978 | Japan | 257/360 |
| 53-145486 | 12/1978 | Japan | 257/360 |
| 54-13780 | 2/1979 | Japan | 257/356 |
| 55-98867 | 7/1980 | Japan | 257/360 |
| 61-15373 | 1/1986 | Japan | 257/360 |

Primary Examiner—Rolf Hille
Assistant Examiner—Steven Loke
Attorney, Agent, or Firm—Sughrue, Mion, Zinn, Macpeak & Seas

[57] ABSTRACT

A protective transistor against electric surge is fabricated on a silicon substrate together with a semiconductor integrated circuit implemented by a plurality of component field effect transistors, and the gate oxide film of the protective transistor is larger in thickness of those of the component field effect transistors of the semiconductor integrated circuit so that the protective transistor is hardly broken down even if the component field effect transistors are scaled down for increasing the integration density.

3 Claims, 8 Drawing Sheets

SEMICONDUCTOR INTEGRATED CIRCUIT WITH INPUT PROTECTIVE TRANSISTOR EFFECTIVE AGAINST ELECTRIC SURGE

FIELD OF THE INVENTION

This invention relates to a semiconductor integrated circuit and, more particularly, to an input protective transistor against static charges incorporated in the semiconductor integrated circuit.

DESCRIPTION OF THE RELATED ART

An integrated circuit is fabricated on a semiconductor chip molded in, for example, a plastic package, and is communicable with an external circuit through a plurality of signal pins projecting from the plastic package. However, the plurality of signal pins are liable to be exposed to undesirable electric surge due to static charges, and the undesirable electric surge is extremely dangerous to component field effect transistors of the integrated circuit. In order to protect the component field effect transistors against the dangerous electric surge, an input protective circuit is usually incorporated in the integrated circuit, and is coupled between the plurality of signal pins and the component field effect transistors of the integrated circuit.

FIGS. 1 and 2 shows essential steps of a typical fabrication process for a semiconductor integrated circuit, and the process sequence starts with preparation of a lightly doped p-type silicon substrate 1. A thick field oxide film 2 is selectively grown on the major surface of the lightly doped p-type silicon substrate 1 through a local oxidation of silicon technique so that a plurality of active areas 1a and 1b are defined in the major surface of the lightly doped p-type silicon substrate 1. In this instance, the active area 1a is assigned to a component field effect transistor of an internal circuitry, and the active area 1b is assigned to a protective transistor of an input protective circuit. After the growth of the thick field oxide film 2, a fresh silicon surface is exposed to the major surface, and gate oxide films 3a and 3b are thermally grown so as to cover the active areas 1a and 1b. Channel doping may be carried out, if necessary. Since the gate oxide films 3a and 3b are concurrently grown, the gate oxide films 3a and 3b are approximately equal in thickness to each other as shown in FIG. 1.

Polysilicon is, thereafter, deposited, and a polysilicon film covers the entire surface of the structure. An appropriate photo mask is patterned on the polysilicon film, and only gate forming areas of the polysilicon film are covered with the photo mask. The exposed portion of the polysilicon film is etched away, and gate electrodes 4a and 4b are concurrently formed on the gate oxide films 3a and 3b, respectively. Using the gate electrodes 4a and 4b as a mask, n-type impurity atoms are ion-implanted into the active areas 1a and 1b, and source and drain regions 5a and 6a are formed in the lightly doped p-type silicon substrate 1. Finally, an appropriate interlevel oxide film 7 is deposited and covers the gate electrodes 4a and 4b as shown in FIG. 2.

Thus, according to the prior art fabrication process sequence, not only the gate oxide film 3a but also the gate oxide film 3b are concurrently grown on the active areas 1a and 1b, and, accordingly, both gate oxide films 3a and 3b are approximately equal in thickness.

However, it is one of the tendencies of the semiconductor manufacturing field to scale down the dimensions of a field effect transistor for enhancing the integration density of a semiconductor integrated circuit. However, if the gate oxide films 3a and 3b are decreased in thickness, the field effect transistor is much liable to be broken down, and a new protection is necessary for the semiconductor integrated circuit. One of the approaches to cope with the scaling-down is to prolong the channel of the protective transistor, and the prolonged channel is effective against undesirable electric surge because of increase of the resistance. Another approach to cope with the scaling down is to widen the channel of the protective transistor and, accordingly, to increase the current driving capability. The protective transistor thus increased in channel width allows surge current to be discharged without increase of the voltage level at the gate electrode of a component transistor of an internal circuitry.

If either approach is applied to the protective transistor of a prior art semiconductor integrated circuit, the prior art semiconductor integrated circuit is fairly proof against undesirable electric surge in so far as the gate oxide film of the protective transistor is relatively thick. However, if component field effect transistors of an internal circuitry are further scaled down, the gate oxide films of the component field effect transistors are proportionally decreased in thickness together with the gate oxide film of the protective transistor, and a problem is encountered in that the gate oxide film of the protective transistor is damaged under application of extremely high surge voltage level.

SUMMARY OF THE INVENTION

It is therefore an important object of the present invention to provide a semiconductor integrated circuit which has an input protective circuit effective against undesirable electric surge.

To accomplish the object, the present invention proposes to increase the thickness of a gate insulating film of an input protective field effect transistor.

In accordance with the present invention, there is provided a semiconductor integrated circuit fabricated on a single semiconductor chip, comprising: a) an internal circuitry having at least one component field effect transistor, the at least one component field effect transistor having a-1) source and drain regions formed in an active area of the single semiconductor chip, and spaced apart from each other by a first channel forming region, a-2) a first gate insulating film covering the first channel forming region, and adjusted to first predetermined thickness, and a-3) a gate electrode formed on the first gate insulating film; and b) an input protective circuit coupled between a plurality of signal pins and the internal circuitry, and having at least one input protective field effect transistor, the at least one input protective field effect transistor having b-1) source and drain regions formed in another active area of the single semiconductor chip, and spaced apart from each other by a second channel forming region, b-2) a second gate insulating film covering the second channel forming region, and adjusted to second predetermined thickness larger than the first predetermined thickness, and a-3) a gate electrode formed on the second gate insulating film.

BRIEF DESCRIPTION OF THE DRAWINGS

The features and advantages of the integrated circuit according to the present invention will be more clearly understood from the following description taken in conjunction with the accompanying drawings in which.

DESCRIPTION OF THE PREFERRED EMBODIMENT

Figure 1:
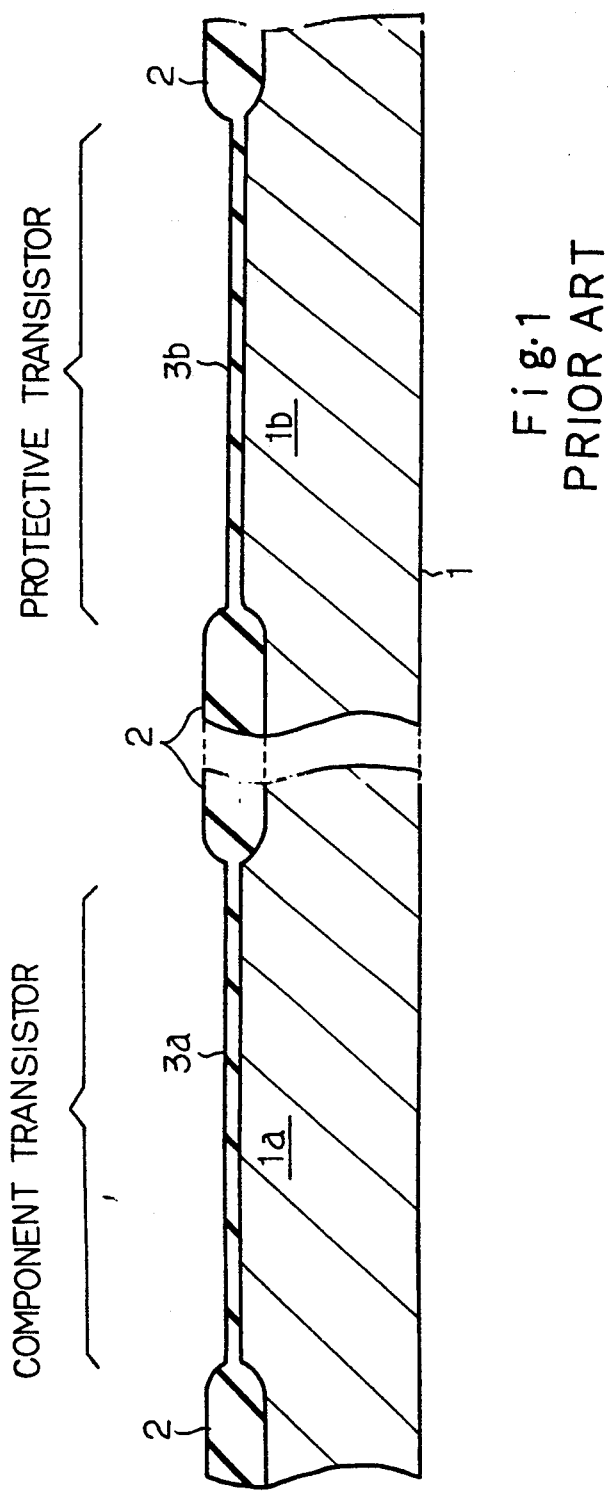
FIG. 1 is a cross sectional view showing an essential step of the prior art process sequence for a semiconductor integrated circuit.
Figure 2:
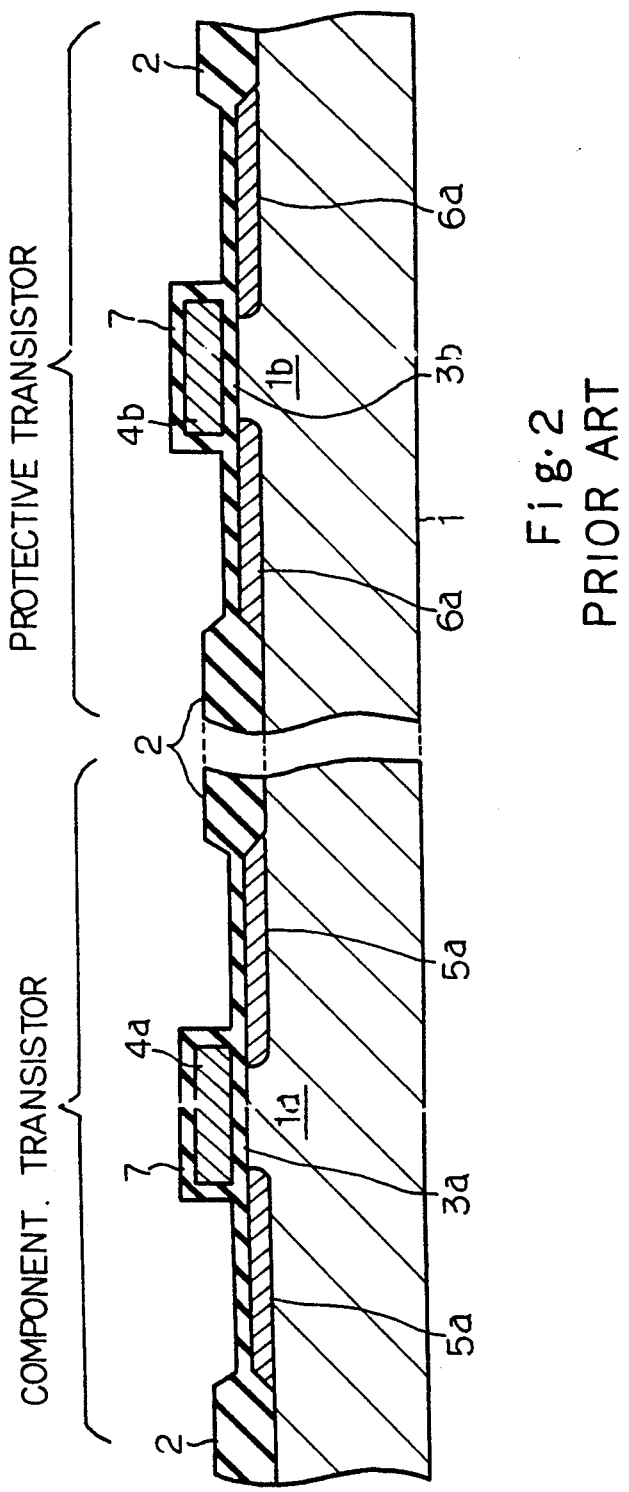
FIG. 2 is a cross sectional view showing the structure of the semiconductor integrated circuit fabricated through the prior art process sequence.
Figure 3:
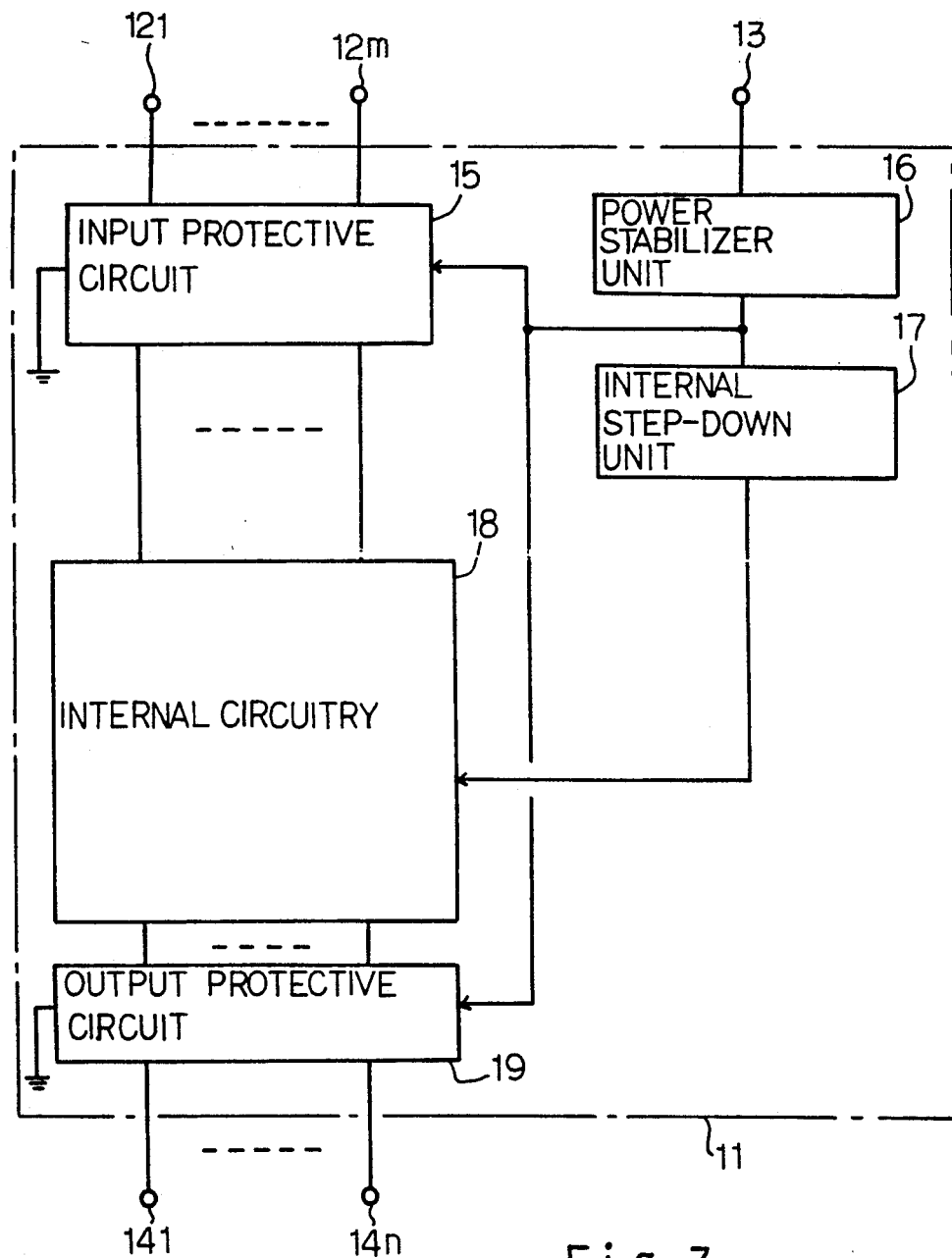
FIG. 3 is a block diagram showing the arrangement of a semiconductor integrated circuit according to the present invention.

Referring to FIG. 3 of the drawings, a semiconductor integrated circuit embodying the present invention is fabricated on a lightly doped p-type single silicon chip 11, and is associated with a plurality of signal input pins 121 to 12m input signals, a power voltage pin 13 for a power voltage level and a plurality of signal output pins 141 to 14n for output signals. The suffixes m and n are arbitrary natural numbers.

The semiconductor integrated circuit comprises an input protective circuit 15 coupled with the plurality of signal input pins 121 to 12m, a power stabilizer unit 16 coupled with the power voltage pin 13, an internal step down unit 17 coupled with the power stabilizer unit 16, an internal circuitry 18 coupled with the input protective circuit 15 for achieving a predetermined task, and an output protective circuit 19 coupled between the internal circuitry 18 and the plurality of output signal pins 141 to 14n. The power stabilizer 16 directly supplies the power voltage level to the input protective circuit 15 and the output protective circuit 19, and the power voltage level is about 5.0 volts in this instance. While any surge voltage level is not applied to any one of the input signal pines 121 to 12m, the input protective circuit 15 transfers input signals from the plurality of input signal pins 121 to 12m to the internal circuitry under the application of the power voltage level. However, upon application of surge voltage level, the input protective circuit 15 discharges the surge current to a ground terminal. The output protective circuit 19 is similar in circuit arrangement and circuit behavior to the input protective circuit 15. Namely, while any surge voltage level is not applied to any one of the output signal pins 141 to 14n, the output protective circuit 19 transfers output signals from the internal circuitry 18 to the plurality of output signal pins 141 to 14n under the application of the power voltage level. However, upon application of surge voltage level, the output protective circuit 15 also discharges the surge current to the ground terminal. The power voltage level is further supplied from the power stabilizer unit 16 to the internal step-down unit 17, and step-down voltage level of the order of 3.3 volts is distributed to the internal circuitry 18, because the gate oxide films of component field effect transistors of the internal circuitry are too thin to withstand the power voltage level. With the step-down voltage level, the internal circuitry 18 achieves the predetermined function on the basis of the input signals, and output signals are supplied from the internal circuitry 18 to the plurality of output data pins 141 to 14n.

The input protective circuit 15 is implemented by a plurality of protective transistors, and component field effect transistors form in combination the internal circuitry 18 together with other circuit components such as, for example, resistors and capacitors. However, the input protective circuit 15 according to the present invention is applicable to any integrated circuit such as, for example, a gate array or a custom-made integrated circuit, and no further description is made on the internal circuitry.

Figure 4:
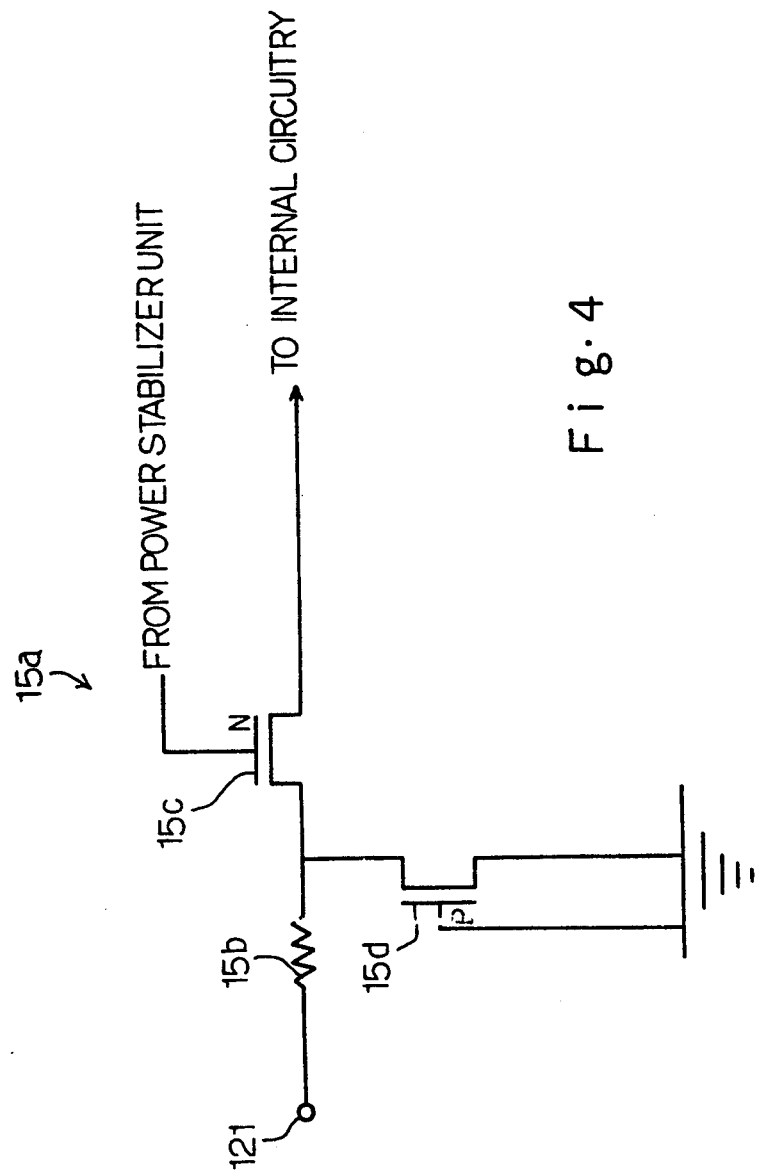
FIG. 4 is a circuit diagram showing the arrangement of a protective unit associated with one of signal input pins.

Turning to FIG. 4 of the drawings, a protective unit 15a associated with one of the input signal pins 121 to 12m is illustrated, and, accordingly, the input protective circuit 15 is implemented by a plurality of protective units similar to the protective unit 15a. The output protective circuit 19 is similarly arranged. The protective unit 15a is assumed to be associated with the input signal pin 121, and comprises a series combination of a resistor 15b and an n-channel type protective transistor 15c coupled between the input signal pin 121 and the internal circuitry 18, and a p-channel type protective transistor 15d coupled between the resistor 15b and the ground voltage line. The power voltage level of 5 volts is applied to the gate electrode of the n-channel type protective transistor 15c, and the ground voltage level is applied to the gate electrode of the p-channel type protective transistor 15d. With the power voltage level at 5 volts, the n-channel type protective transistor 15c is turned on, and transfers an input signal applied to the input signal node 121. However, the p-channel type protective transistor 15d never turns on in the presence of the input signal at the drain node thereof. If undesirable electric surge much higher than the input signal is applied to the input signal pin 121, the n-channel type protective transistor 15c turns off, and the p-channel type protective transistor 15d turns on. Then, the surge voltage level is discharged through the p-channel type protective transistor 15d to the ground voltage line, and the n-channel type protective transistor 15c protects the internal circuitry 18 against the surge voltage level.

Figure 5:
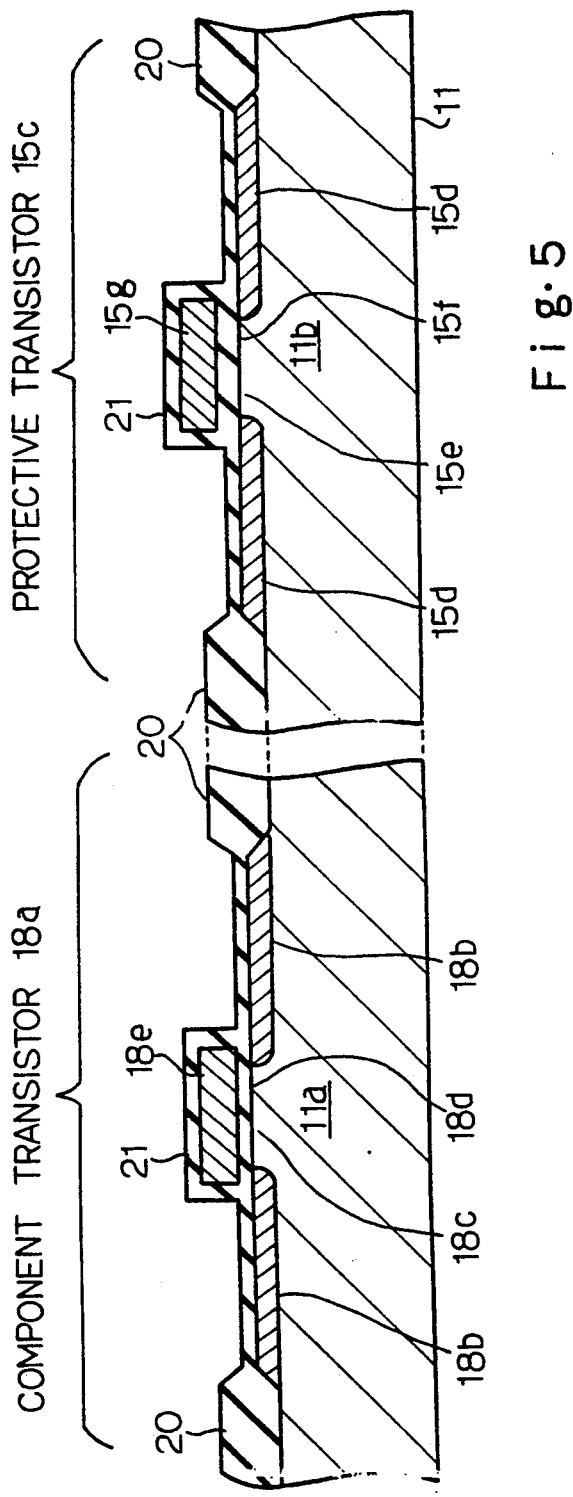
FIG. 5 is a cross sectional view showing essential parts of the semiconductor integrated circuit shown in FIG. 3.

FIG. 5 shows the structure of an n-channel type component transistor 18a of the internal circuitry 18 and the structure of the n-channel type protective transistor 15c. The n-channel type component transistor 18a is formed in an active area 11a of the lightly doped p-type silicon chip 11, and comprises source and drain regions 18b spaced apart from each other by a channel forming region 18c, a thin gate oxide film 18d grown over the channel forming region 18c and a gate electrode 18e formed on the thin gate oxide film 18d. The active area 11a is isolated from an active area 11b by a thick field oxide film 20, and the n-channel type protective transistor 15c is fabricated in the active area 11b. The n-channel type protective transistor 15c comprises source and drain regions 15d spaced apart form each other by a channel forming region 15e, a thin gate oxide film 15f grown over the channel forming region 15e and a gate electrode 15g formed on the thin gate oxide film 15f. Both transistors 15c and 18a kare covered with an inter-level oxide film 21. In this instance, the gate oxide film 18d is about 15 nano-meters in thickness, and the gate oxide film 15f is about 20 nano-meters in thickness. Thus, the gate oxide film 15f of the n-channel type protective transistor 15c is thicker than the gate oxide film 18d of the n-channel type component transistor 18a, and the n-channel type protective transistor 15c is less liable to be broken down due to surge voltage level. Moreover, the positive power voltage level of 5 volts is applied to the gate electrode 15g, and, for this reason, the n-channel type protective transistor 15c perfectly transfers the input signal to the internal circuitry 18.

The channel forming region 15e of the n-channel type protective transistor 15c may be prolonged so as to increase the channel resistance rather than the channel forming region 18c. Similarly, the p-channel type protective transistor 15d may be increased in channel width rather than the component transistors of the internal circuitry 18.

Description is hereinbelow made on a process sequence for fabricating the structure shown in FIG. 5. Although the description is focused on one of the n-channel type component field effect transistors of the internal circuitry 18 and the n-channel type protective transistor 15c for one of the protective units, the other transistors are simultaneously fabricated through the same process sequence.

Figure 6A:
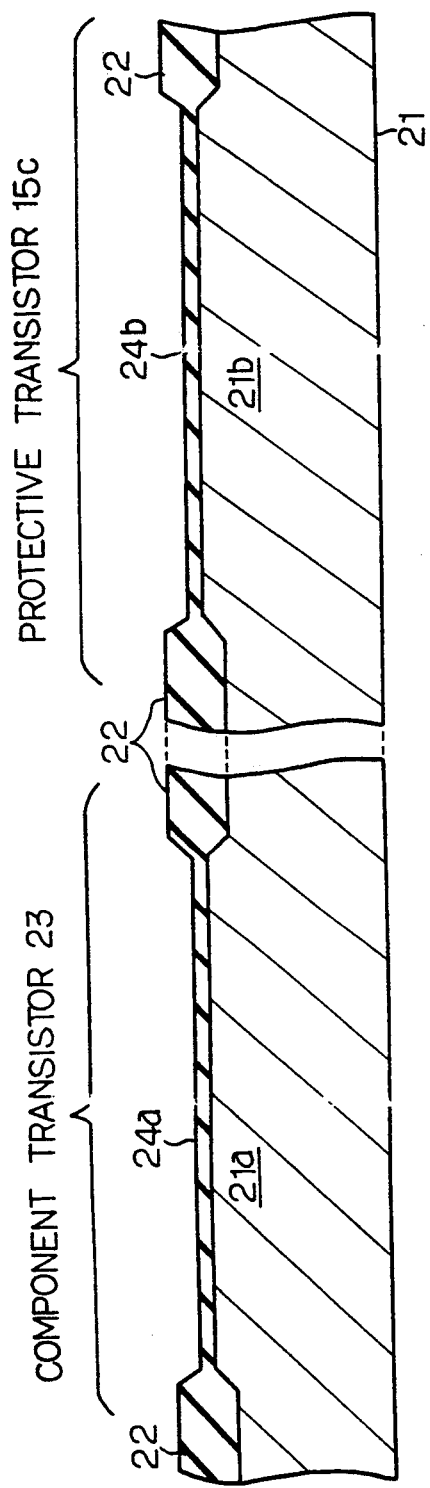
FIGS. 6A to 6C are cross sectional views showing essential stages of a process sequence for fabricating the structure shown in FIG. 4.

The process sequence starts with preparation of a lightly doped p-type silicon substrate 21, and the lightly doped p-type silicon chip 11 forms a part of the lightly doped p-type silicon substrate 21. First, a thick field oxide film 22 is grown on the major surface of the lightly doped p-type silicon substrate 21 to thickness of 600 nanometers, and defines a plurality of active areas 21a and 21b in the major surface. The active areas 21a and 21b are respectively assigned to one of the n-channel type component field effect transistors 23 and the n-channel type protective transistor 15c. After the formation of the thick field oxide film 22, a fresh surface of the lightly doped p-type silicon substrate 21 is exposed, and silicon oxide films 24a and 24b are thermally grown to thickness of about 15 nano-meters. All of the gate oxide films are approximately equal in thickness in this stage as shown in FIG. 6A.

Subsequently, photo-resist solution is spun coated onto the entire surface of the structure shown in FIG. 6A, and, accordingly, a photo-resist film is formed thereon. An appropriate photo mask is applied to the photo-resist film, and the pattern of the photo mask is transferred to the photo resist film. When the photo resist film is developed in appropriate solution, the photo resist film is partially removed, and a mask layer 24 is left on the active area 21b. With the mask layer 24, the silicon oxide film 24a is etched away in appropriate etching solution, and a fresh surface of the lightly doped p-type silicon substrate 21 is exposed again as shown in FIG. 6B.

Figure 6B:
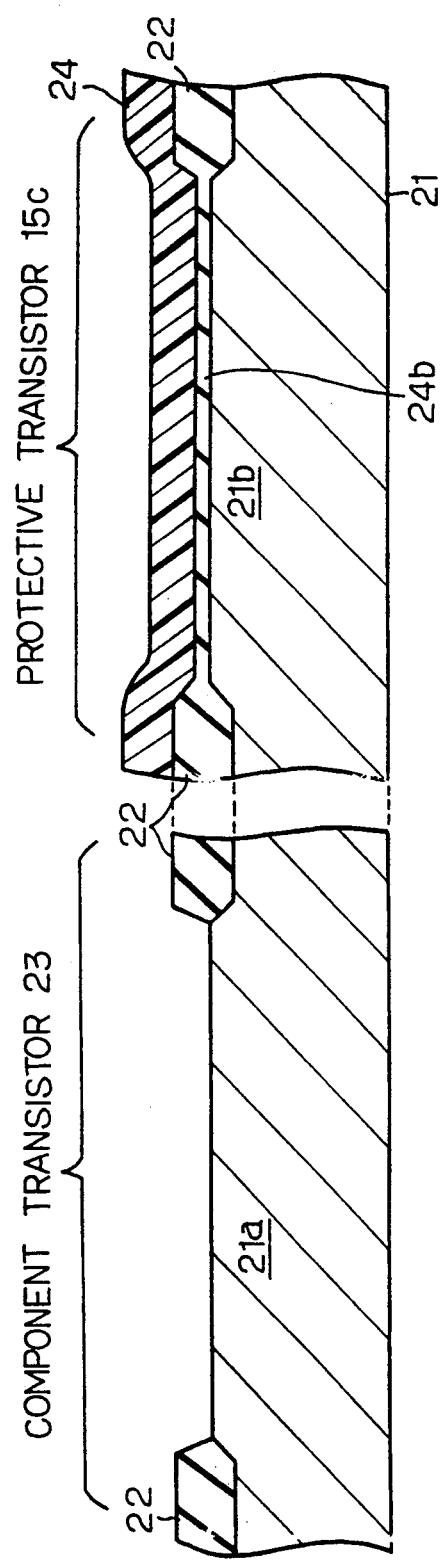
Figure 6C:
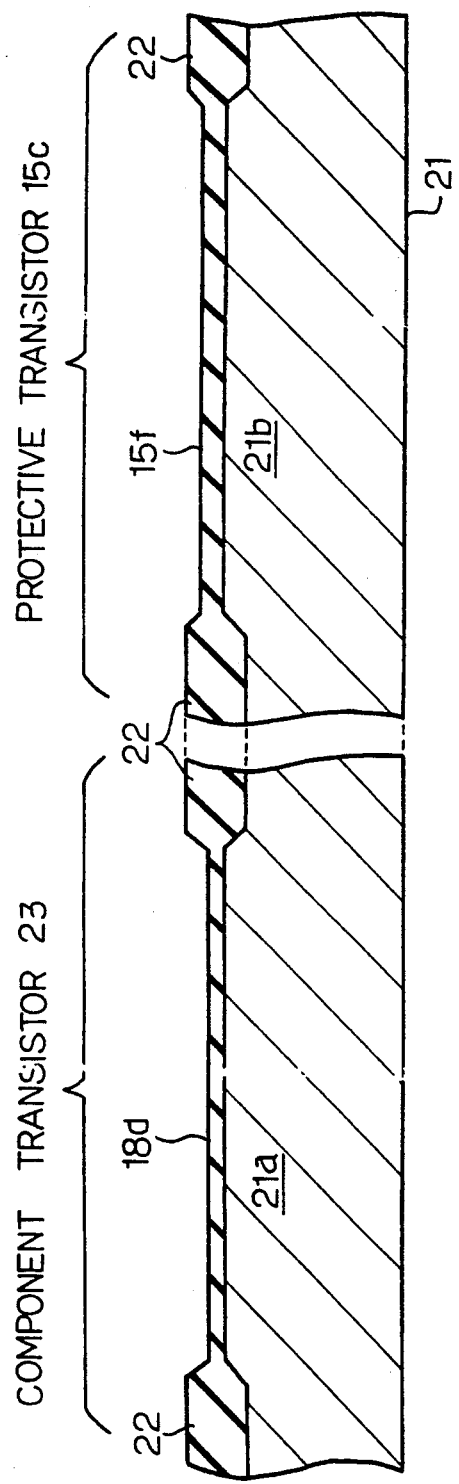

The mask layer 24 is removed from the structure shown in FIG. 6B, and silicon oxide is thermally grown again. During the thermal oxidation, a silicon oxide film is newly grown to thickness of about 15 nano-meters in the active area 21a, and the silicon oxide film 24b is increased in thickness to about 20 nano-meters. The newly grown silicon oxide film serves as the gate oxide film 18d, and the silicon oxide film increased in thickness serves as the gate oxide film 15f as shown in FIG. 6C.

After the formation of the gate oxide films 18d and 15f, channel doping is carried out, and the gate electrodes 18e and 15g are patterned on the respective gate oxide films 18d and 15f. Finally, the inter-level oxide film 21 is provided over the gate electrodes 18e and 15g as described with reference to FIG. 5.

Thus, the n-channel type protective transistors 15c have the gate oxide films 15f larger in thickness than those of the n-channel type component field effect transistors of the internal circuitry, and, for this reason, the n-channel type protective transistors 15c are hardly damaged in the presence of electric surge even if the component transistors of the internal circuitry are scaled down.

Although particular embodiments of the present invention have been shown and described, it will be obvious to those skilled in the art that various changes and modifications may be made without departing from the spirit and scope of the present invention. For example, the gate oxide films 15f and 18d may be replaced with insulating films of another dielectric substance different in thickness in accordance with the present invention. Moreover, either power or step-down voltage level may be distributed to not only the internal circuitry but also the input and output protective units.

What is claimed is:

1. A semiconductor integrated circuit fabricated on a single semiconductor chip, comprising:
    a) an internal circuitry having at least one component field effect transistor, said at least one component field effect transistor having a - 1) source and drain regions formed in an active area of said single semiconductor chip, and spaced apart from each other by a first channel forming region, a - 2) a first gate insulating film covering said first channel forming regions, and adjusted to first predetermined thickness, and a - 3) a gate electrode formed on said first gate insulating film, and supplied with a step down voltage level produced from a power voltage level; and
    b) an input protective circuit coupled between a plurality of signal pins and said internal circuitry, and having at least one input protective field effect transistor, said at least one input protective field effect transistor having b - 1) source and drain regions formed in another active area of said single semiconductor chip, and spaced apart from each other by a second channel forming region, b - 2) a second gate insulating film covering said second channel forming region, and adjusted to second predetermined thickness larger than said first predetermined thickness, and b - 3) a gate electrode formed on said second gate insulating film, and supplied with said power voltage level.

2. A semiconductor integrated circuit as set forth in claim 1, in which said first and second gate insulating films are about 15 nano-meters and about 20 nano-meters in thickness.

3. A semiconductor integrated circuit as set forth in claim 1, in which an output protective circuit similar in arrangement to said input protective circuit is coupled between said internal circuitry and a plurality of output data pins.

* * * * *